(12) United States Patent
Matsukawa

(10) Patent No.: US 9,221,673 B2
(45) Date of Patent: Dec. 29, 2015

(54) ELECTRONIC DEVICE, INTEGRATED CIRCUIT, ELECTRONIC APPARATUS, AND MOVING OBJECT

(71) Applicant: Seiko Epson Corporation, Tokyo (JP)

(72) Inventor: Norihito Matsukawa, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/255,360

(22) Filed: Apr. 17, 2014

(65) Prior Publication Data

US 2014/0312437 A1    Oct. 23, 2014

(30) Foreign Application Priority Data

Apr. 18, 2013    (JP) .................................. 2013-087393

(51) Int. Cl.
| | |
|---|---|
| B81B 7/00 | (2006.01) |
| B81C 1/00 | (2006.01) |
| G01C 19/56 | (2012.01) |
| G01P 15/00 | (2006.01) |
| G01P 15/09 | (2006.01) |
| G01P 15/097 | (2006.01) |

(52) U.S. Cl.
CPC ........... *B81B 7/0064* (2013.01); *B81C 1/00253* (2013.01); *G01C 19/56* (2013.01); *G01P 15/00* (2013.01); *G01P 15/09* (2013.01); *G01P 15/097* (2013.01); *B81B 2201/0235* (2013.01); *B81B 2201/0242* (2013.01)

(58) Field of Classification Search
CPC ................ B81B 3/0021; B81B 7/0064; B81B 2201/0242; G01P 15/09; G01P 15/097; G01P 15/00; G01C 19/56; B81C 1/00253
See application file for complete search history.

(56) References Cited

U.S. PATENT DOCUMENTS

| 6,262,614 B1 | 7/2001 | Sasaki | |
|---|---|---|---|
| 2012/0032286 A1* | 2/2012 | Trusov et al. | 257/417 |
| 2012/0074818 A1* | 3/2012 | Crowley et al. | 310/348 |

FOREIGN PATENT DOCUMENTS

| EP | 1742068 A1 | 1/2007 |
|---|---|---|
| JP | 2001-068553 A | 3/2001 |
| JP | 2004-301786 A | 10/2004 |
| JP | 2005-012052 A | 1/2005 |
| JP | 2009-087988 A | 4/2009 |
| WO | WO-2005-103726 A1 | 11/2005 |

* cited by examiner

*Primary Examiner* — William Coleman
(74) *Attorney, Agent, or Firm* — Harness, Dickey & Pierce, P.L.C.

(57) ABSTRACT

An electronic device includes a vibrating element that detects a predetermined physical quantity, an integrated circuit that is electrically connected to the vibrating element, and a ceramic package. The ceramic package is provided with a first external terminal and a second external terminal to which a constant potential is supplied. The first external terminal is electrically connected to the second external terminal in a first mode, and is electrically connected to an internal node of the integrated circuit in a second mode.

19 Claims, 6 Drawing Sheets

ELECTRONIC DEVICE, INTEGRATED CIRCUIT, ELECTRONIC APPARATUS, AND MOVING OBJECT

BACKGROUND

1. Technical Field

The present invention relates to an electronic device, an integrated circuit, an electronic apparatus, and a moving object.

2. Related Art

Currently, in various systems or electronic apparatuses, physical quantity sensors, which are capable of detecting various physical quantities, such as an acceleration sensor that detects acceleration and a gyro sensor that detects an angular velocity have been widely used. Particularly, recently, an angular velocity sensor or an acceleration sensor is embedded in a portable apparatus such as a smart phone, and thus miniaturization and thickness reduction of a sensor package have become important. Generally, in the final inspection of a physical quantity sensor, various internal signals of an IC, which drives a vibration element and detects a physical quantity, are monitored from an external terminal of the sensor package, or signals are applied to the IC from the external terminal of the sensor package to determine whether or not the operation is normal. Therefore, the internal signals are output to a plurality of multifunctional I/O terminals in a test mode. In addition, the internal signals, which can be simultaneously monitored, depend on the number of the multifunctional I/O terminals. Accordingly, a plurality of test modes are provided, and the internal signals output from the multifunctional I/O terminal are switched in order for numerous internal signals to be monitored. For examples, Pamphlet of International Publication No. 2005/103726 suggests an angular velocity sensor which includes a switch circuit having a number of input terminals in accordance with the number of respective outputs of an angular velocity detection element and a signal processing unit and in which a connection state of the switch circuit is switched according to a mode signal output from a mode signal generation circuit to select any one of the respective outputs of the angular velocity detection element and the signal processing unit, and the signal that is selected is supplied to an output terminal.

In the related art, the multifunctional I/O terminal is used only during adjustment and inspection, and failure analysis, and is set as a non-connection (NC) terminal in a usage state by a user (during typical operation of a physical quantity sensor). That is, the multifunctional I/O terminal is provided for a function that is used only for the adjustment and inspection, and the failure analysis. Therefore, the multifunctional I/O terminal becomes a terminal that has no meaning in the usage state by a user. This is also applicable to electronic devices other than the physical quantity sensor.

SUMMARY

An advantage of some aspects of the invention is to provide an electronic device capable of being effectively used even in a mode in which a user uses an external terminal for a test, an integrated circuit, an electronic apparatus and a moving object which use the electronic device, and an electronic apparatus and a moving object which use the integrated circuit.

The invention can be implemented as the following forms or application examples.

Application Example 1

This application example is directed to an electronic device including a vibrating element that outputs an electrical signal, an integrated circuit that is electrically connected to the vibrating element, and a package. The package includes a first external terminal, and a second external terminal that is electrically connected to a constant potential source. The first external terminal is electrically connected to the second external terminal in a first mode, and is electrically connected to an internal node of the integrated circuit in a second mode.

The constant potential source may be, for example, a power supply or a ground.

The electronic device according to this application example may be a device that operates on the basis of an electrical signal that is output from the vibrating element. For example, the electronic device may be an inertial sensor such as an acceleration sensor, a gyro sensor (angular velocity sensor), and a speed sensor, an inclinometer that measures an inclination angle on the basis of gravity, a physical quantity sensor such as a pressure sensor that measures a pressure, or an oscillator that uses various vibrating elements such as a tuning fork type vibrator, an AT vibrator, a silicon vibrator, and a piezoelectric vibrator.

According to the electronic device of this application example, the first external terminal can be used for a test in the second mode. In addition, in the first mode, the first external terminal is electrically connected to the second external terminal to set a constant potential, and thus it is possible to allow the first external terminal to function as a shield against an external noise. Accordingly, according to the electronic device of this application example, it is possible to effectively use the external terminal for a test even in a mode in which a user uses the external terminal.

In addition, according to the electronic device of this application example, the first external terminal is electrically connected to the second terminal in the first mode, and thus it is possible to stably perform shielding in an electronic device unit.

Application Example 2

In the electronic device according to the application example described above, the integrated circuit may include a first terminal that is electrically connected to the first external terminal, a second terminal that is electrically connected to the second external terminal, and a switching control circuit which electrically connects the first terminal and the second terminal in the first mode, and which electrically connects the first terminal and the internal node in the second mode.

According to the electronic device of this application example, it is possible to easily control electrical connection of the first external terminal to either the second external terminal or the internal node of the integrated circuit by changing the setting of the integrated circuit.

Application Example 3

In the electronic device according to the application example described above, the integrated circuit may further include a third terminal that is electrically connected to an output terminal of the vibrating element, and among a plurality of terminals provided to the integrated circuit, the third terminal may be provided at a position that is closest to an arbitrary corner of the integrated circuit in a plan view of the integrated circuit.

According to the electronic device of this application example, an interconnection pattern, which connects the output terminal of the vibrating element and the third terminal of the integrated circuit, can be made to be short, and the third terminal can be spaced away from a digital input and output terminal of the integrated circuit. Accordingly, it is possible to reduce an effect of noise on an output signal of the vibrating element.

Application Example 4

In the electronic device according to the application example described above, the integrated circuit may further include a third terminal that is electrically connected to an output terminal of the vibrating element, and a fourth terminal to or from which a digital signal is input or output, and the first terminal may be provided between the third terminal and the fourth terminal.

According to the electronic device of this application example, in the first mode, the first terminal of the integrated circuit has a constant potential, and thus it is possible to shield capacitive coupling between the third terminal of the integrated circuit to which an output signal of the vibrating element is input, and the fourth terminal of the integrated circuit to or from which a digital signal is input or output. Accordingly, it is possible to reduce an effect of noise due to the digital signal on the output signal of the vibrating element.

Application Example 5

In the electronic device according to the application example described above, among a plurality of terminals provided to the integrated circuit, the third terminal may be provided at a position that is closest to an arbitrary corner of the integrated circuit in a plan view of the integrated circuit.

According to the electronic device of this application example, an interconnection pattern, which connects the output terminal of the vibrating element and the third terminal of the integrated circuit, can be made to be short, and the third terminal can be spaced away from the fourth terminal of the integrated circuit to or from which a digital signal is input or output. Accordingly, it is possible to reduce an effect of noise on an output signal of the vibrating element.

Application Example 6

In the electronic device according to the application example described above, the package may include a first layer. The first layer may be provided with a first interconnection pattern that electrically connects the first external terminal and the first terminal of the integrated circuit, a second interconnection pattern that electrically connects the output terminal of the vibrating element and the third terminal of the integrated circuit, and a third interconnection pattern that is electrically connected to the fourth terminal of the integrated circuit. The first interconnection pattern may be provided between the second interconnection pattern and the third interconnection pattern.

According to the electronic device of this application example, in the first mode, the first interconnection pattern that is connected to the first terminal of the integrated circuit has a constant potential, and thus it is possible to shield capacitive coupling between the second interconnection pattern which is connected to the third terminal of the integrated circuit and through which an output signal of the vibrating element propagates, and the third interconnection pattern which is connected to the fourth terminal of the integrated circuit and through which a digital signal propagates. Accordingly, it is possible to reduce an effect of the digital signal on the output signal of the vibrating element.

Application Example 7

In the electronic device according to the application example described above, the package may include a second layer that is located between the first layer and the first external terminal. A fourth interconnection pattern having a constant potential may be provided in the second layer, and in a plan view of the second layer, the fourth interconnection pattern may include a region that overlaps with the second interconnection pattern.

According to the electronic device of this application example, it is possible to shield an output signal of the vibrating element from noise, which propagates through the second interconnection pattern, due to the fourth interconnection pattern which faces the second interconnection pattern and has a constant potential.

Application Example 8

In the electronic device according to this application example described above, among external terminals of the package, the first external terminal may be provided at a position that is closest to an arbitrary corner of the package in a plan view of the package.

According to the electronic device of this application example, the first external terminal is electrically connected to the second external terminal with a constant potential at the inside of the package, and thus even when the first external terminal is peeled from a printed substrate, a shielding effect can be retained. Accordingly, it is possible to dispose the first external terminal at a corner portion at which mounting reliability is lowest. Accordingly, it is possible to provide an important terminal at a position at which high reliability can be secured.

Application Example 9

In the electronic device according to the application example described above, the integrated circuit may include a detection circuit that generates a physical quantity signal on the basis of a signal transmitted from a vibrating element, and the first external terminal may be electrically connected to the second external terminal in the first mode, and may be electrically connected to an internal node of the detection circuit of the integrated circuit in the second mode.

According to the electronic device of this application example, in a mode in which a user uses an external terminal connected to the internal node of the detection circuit for a test, it is possible to allow the external terminal to function as a shield against an external noise.

Application Example 10

This application example is directed to an electronic apparatus including any one of the electronic devices described above.

Application Example 11

This application example is directed to a moving object including any one of the electronic devices described above.

Application Example 12

This application example is directed to an integrated circuit including a first terminal that is electrically connected to a first external terminal, a second terminal that is electrically connected to a second external terminal that is electrically connected to a constant potential source, an internal node, and a switching control circuit which electrically connects the first terminal and the second terminal in a first mode, and which electrically connects the first terminal and the internal node in a second mode.

According to the integrated circuit of this application, it is possible to easily control electrical connection of the first external terminal to either the second external terminal or the internal node by changing the setting of the integrated circuit.

Application Example 13

The integrated circuit according to the application example described above may further include a terminal arrangement portion in which a plurality of terminals are arranged. A third terminal, which is electrically connected to a vibrating element that outputs an electrical signal, may be provided in the terminal arrangement portion, and among the plurality of terminals that are provided to the integrated circuit, the third terminal may be provided at a position that is closest to an arbitrary corner of the terminal arrangement portion in a plan view of the terminal arrangement portion.

According to the integrated circuit of this application example, an interconnection pattern, which connects the output terminal of the vibrating element and the third terminal, can be made to be short, and the third terminal can be spaced away from a digital input and output terminal. Accordingly, it is possible to reduce an effect of noise on an output signal of the vibrating element.

Application Example 14

The integrated circuit according to the application example described above may further include a third element that is electrically connected to a vibrating element that outputs an electrical signal, and a fourth terminal to or from which a digital signal is input or output. The first terminal may be provided between the third terminal and the fourth terminal.

According to the integrated circuit of this application example, in the first mode, the first terminal of the integrated circuit has a constant potential, and thus it is possible to shield capacitive coupling between the third terminal to which an output signal of the vibrating element is input, and the fourth terminal to or from which a digital signal is input or output. Accordingly, it is possible to reduce an effect of noise due to the digital signal on the output signal of the vibrating element.

Application Example 15

The integrated circuit according to the application example described above may further include a terminal arrangement portion in which a plurality of terminals are arranged. Among the plurality of terminals in the terminal arrangement portion, the third terminal is provided at a position that is closest to an arbitrary corner of the terminal arrangement portion in a plan view of the terminal arrangement portion.

According to the integrated circuit of this application example, an interconnection pattern, which connects the output terminal of the vibrating element and the third terminal, can be made to be short, and the third terminal can be spaced away from the fourth terminal to or from which a digital signal is input or output. Accordingly, it is possible to reduce an effect of noise on an output signal of the vibrating element.

Application Example 16

The integrated circuit of this application example described above may further include a detection circuit that generates a physical quantity signal on the basis of a signal transmitted from a vibrating element. The switching control circuit may electrically connect the first terminal and the second terminal in the first mode, and electrically connects the first terminal and an internal node of the detection circuit in the second mode.

According to the integrated circuit of this application example, it is possible to easily control electrical connection of the first external terminal to either the second external terminal or the internal node of the detection circuit by changing setting.

Application Example 17

This application example is directed to an electronic apparatus including any one of the integrated circuits described above.

Application Example 18

This application example is directed to a moving object including any one of the integrated circuits described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the attached drawings. In addition, the following embodiments are not intended to limit the content of the invention described in the appended claims. In addition, it cannot be said that the entire configurations described below are essential construction requirements of the invention.

1. Electronic Device

Figure 1:
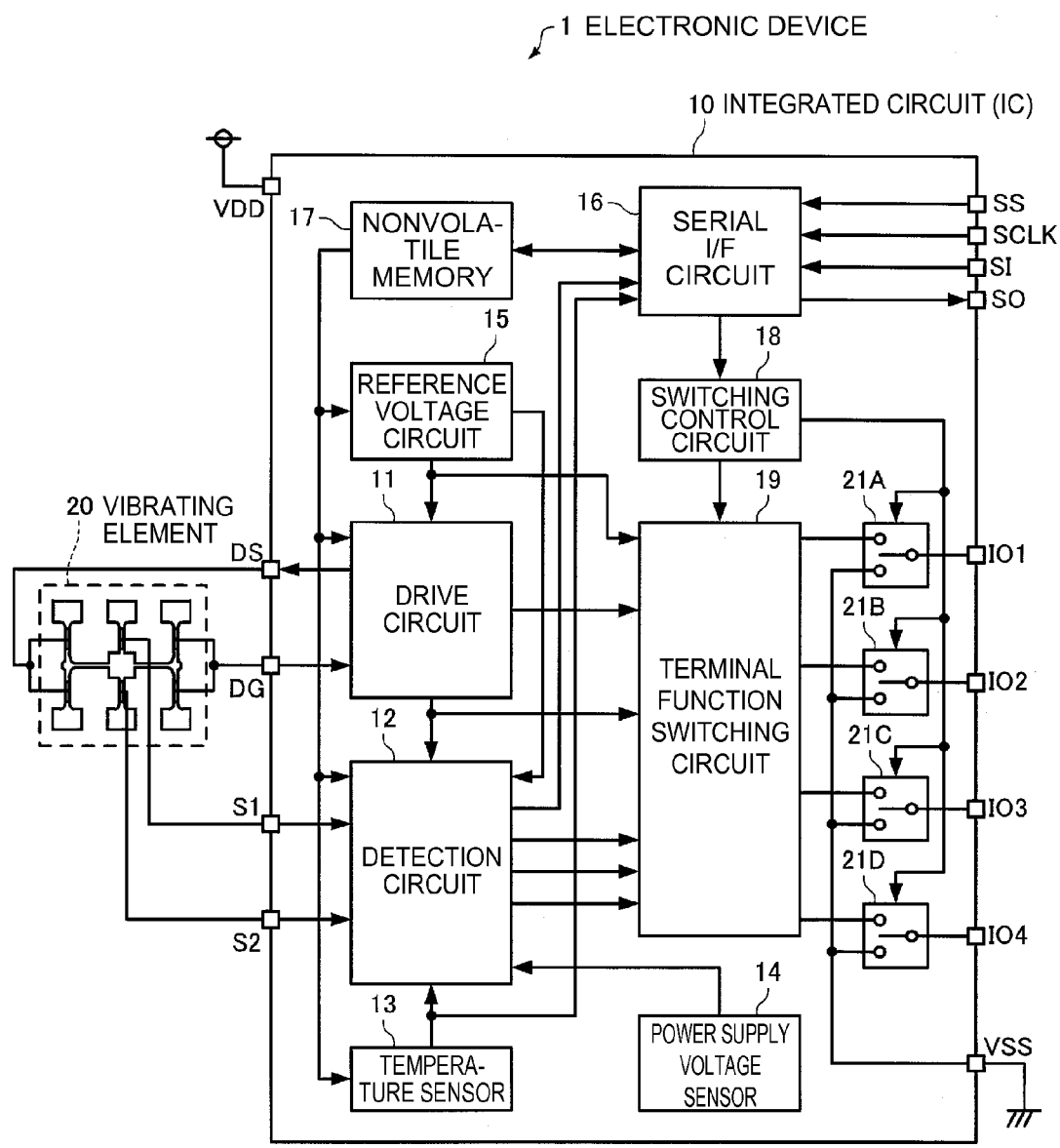
FIG. 1 is a view illustrating an example of a functional block diagram of an electronic device of this embodiment.

Hereinafter, as the electronic device according to the invention, a physical quantity sensor (particularly, an angular velocity sensor) will be described as an example. FIG. 1 is an example of a functional block diagram of the electronic device of this embodiment. As shown in FIG. 1, the electronic device 1 of this embodiment includes an integrated circuit (IC) 10 and a vibrating element 20.

In FIG. 1, the vibrating element 20 is a vibration-type piezoelectric angular velocity detection element in which two drive electrodes and two detection electrodes are formed in a so-called double T-type quartz vibrator element including two T-type drive vibrating arms and one detection vibrating arm formed between the drive vibrating arms.

When an alternating voltage signal as a drive signal is supplied to the two drive vibrating arms of the vibrating element 20, the two drive vibrating arms perform flexural vibration (excitation vibration) in which distal ends approach each other and are spaced from each other in a repetitive manner due to an inverse piezoelectric effect. When amplitudes of the flexural vibration of the two drive vibrating arms are equal to each other, the two drive vibrating arms perform the flexural vibration in a linear symmetric relation with respect to the detection vibrating arm at all times, and thus the detection vibrating arm does not cause vibration.

In this state, an angular velocity in a state in which an axis perpendicular to an excitation vibrating surface of the vibrating element 20 is set as a rotation axis is applied, the two drive vibrating arms obtain a Coriolis force in a direction perpendicular to both of the flexural vibration direction and the rotation axis. As a result, symmetry in the flexural vibration of the two drive vibrating arms collapses, and thus the detection vibrating arm performs flexural vibration to maintain balance. A phase difference between the flexural vibration of the detection vibrating arm and the flexural vibration (excitation vibration) of the drive vibrating arms, which accompanies the Coriolis force, is 90°. In addition, an alternating current charge of an inverse phase (phase is different by 180°), which is based on the flexural vibration, occurs at the two detection electrodes due to a piezoelectric effect. The alternating current charge varies in accordance with the magnitude of the Coriolis force (in other words, the magnitude of the angular velocity applied to the vibrating element 20).

In addition, the vibrating element of the vibrating element 20 may not be the double T-type. For example, the vibrating element may be a tuning fork type or a tooth type, or a tuning bar type having a shape such as a triangular prism, a quadrangular prism, and a circular column. In addition, as a material of the vibrator element of the vibrating element 20, for example, a piezoelectric single crystal such as lithium tantalate ($LiTaO_3$) and lithium niobate ($LiNbO_3$) or a piezoelectric material such as piezoelectric ceramics including lead zirconate titanate (PZT) may be used, and a silicon semiconductor may be used instead of quartz ($SiO_2$). In addition, for example, the vibrator element may have a structure in which a piezoelectric thin film such as zinc oxide (ZnO) and aluminum nitride (AlN) inserted into a drive electrode is disposed on a part of a surface of the silicon semiconductor.

In addition, the vibrating element 20 is not limited to the piezoelectric vibrating element, and may be a vibrating element of an electromotive type, an electrostatic capacity type, an eddy current type, an optical type, a strain gauge type, and the like. In addition, a physical quantity that is detected by the vibrating element 20 is not limited to the angular velocity, and may be angular acceleration, acceleration, a velocity, a force, and the like.

As shown in FIG. 1, in this embodiment, the two drive electrode of the vibrating element 20 are connected to a DS terminal and a DG terminal of the integrated circuit (IC) 10, respectively. In addition, the two detection electrodes of the vibrating element 20 are connected to an S1 terminal and an S2 terminal of the integrated circuit (IC) 10, respectively.

The integrated circuit (IC) 10 includes a drive circuit 11, a detection circuit 12, a temperature sensor 13, a power supply voltage sensor 14, a reference voltage circuit 15, a serial interface circuit 16, a nonvolatile memory 17, a switching control circuit 18, a terminal function switching circuit 19, and a switch circuits 21A to 21D. In addition, the integrated circuit (IC) 10 of this embodiment may have a configuration in which parts of the elements shown in FIG. 1 are omitted or modified, or other elements are added.

The reference voltage circuit 15 generates a constant voltage or a constant current of a reference potential (analog ground voltage) and the like from a power supply voltage supplied from a VDD terminal, and supplies the constant voltage or the constant current to the drive circuit 11, the detection circuit 12, and the temperature sensor 13.

The drive circuit 11 generates a drive signal that allows the vibrating element 20 to perform excitation vibration, and supplies the drive signal to one of the drive electrodes of the vibrating element 20 through the DS terminal. In addition, a drive current (quartz current) that is generated in the other drive electrode by the excitation vibration of the vibrating element 20 is input to the drive circuit 11 through the DG terminal, and the drive circuit 11 performs feedback control of an amplitude level of a drive signal in order for an amplitude of the drive current to be maintained constantly. In addition, the drive circuit 11 generates a signal whose phase deviates from that of the drive signal by 90°, and supplies the signal to the detection circuit 12.

Alternating current charges (detection currents) that are generated in the respective two detection electrodes of the vibrating element 20 are input to the detection circuit 12 through the S1 terminal and the S2 terminal, respectively. The detection circuit 12 detects only an angular velocity component contained in the alternating current charges (detection currents) and generates a signal (angular velocity signal) of a voltage level in correspondence with the magnitude of the angular velocity. In this embodiment, the detection circuit 12 converts the detection currents input from the S1 and S2 terminals into voltages, and further performs A/D conversion by setting the signal (signal having a phase deviated from that of the drive signal by 90°) supplied from the drive circuit 11 to a sampling clock to generate a detection signal (angular velocity signal) by digital processing.

The temperature sensor 13 generates a signal in which a voltage approximately linearly varies according to a temperature variation, A/D converts this signal, and outputs the converted signal. The temperature sensor 13 may be realized by using, for example, a band gap reference circuit.

The power supply voltage sensor 14 A/D converts a power supply voltage value that is supplied from the VDD terminal and outputs the converted power supply voltage value.

A selection signal, a clock signal, and a serial input signal are input to the serial interface circuit 16 through an SS terminal, an SCLK terminal, and an SI terminal, respectively. When the selection signal is enable, the serial interface circuit 16 samples the serial input signal with the clock signal and performs a process of analyzing a command that is included in the serial input signal or a process of converting serial data that is included in the serial input signal into parallel data. In addition, the serial interface circuit 16 performs data writing (setting) or reading process with respect to the nonvolatile memory 17 or an internal register (not shown) according to a command. In addition, the serial interface circuit 16 performs a process of converting the data that is read out from the nonvolatile memory 17 or the internal register into serial data and outputting the serial data to the outside through an SO terminal.

The nonvolatile memory 17 stores various kinds of adjustment data or correction data with respect to the drive circuit 11, the detection circuit 12, and the temperature sensor 13.

The nonvolatile memory 17 may be realized by, for example, a metal oxide nitride oxide silicon (MONOS) type memory.

In a process of generating an angular velocity signal, the detection circuit 12 performs zero-point power supply voltage correction, zero-point temperature correction, and sensitivity temperature correction of the angular velocity signal by using the digital output signal supplied from the temperature sensor 13 and the power supply voltage sensor 14, and the correction data stored in the nonvolatile memory 17.

The angular velocity signal (digital signal) generated by the detection circuit 12 is supplied to the serial interface circuit 16.

The terminal function switching circuit 19 switches a connection destination of each of four terminals IO1, IO2, IO3, and IO4. For example, the terminal function switching circuit 19 selects an output signal or an internal signal of the drive circuit 11, the detection circuit 12, and the reference voltage circuit 15 under control of the switching control circuit 18, and outputs the selected signal to the outside from any one of the IO1, IO2, IO3, and IO4. In addition, the terminal function switching circuit 19 may supply an external signal that is input from any one of the IO1, IO2, IO3, and IO4 to the drive circuit 11, the detection circuit 12, and the reference voltage circuit 15.

The switch circuits 21A to 21D electrically connect the IO1 terminal to either the terminal function switching circuit 19 or a VSS terminal under control of the switching control circuit 18.

The switching control circuit 18 controls the switching of the connection destination of the four terminals IO1, IO2, IO3, and IO4 according to a setting value received from the serial interface circuit 16. In addition, the switching control circuit 18 controls the switch circuits 21A to 21D according to a mode that is set from the serial interface circuit 16 to electrically connect the respective terminals IO1, IO2, IO3, and IO4 (an example of a first terminal) and the VSS terminal (an example of a second terminal) to each other in a typical operation mode (an example of a first mode), and to connect the respective terminals IO1, IO2, IO3, and IO4 and a predetermined internal node through the terminal function switching circuit 19 to each other in a test mode (an example of a second mode). Accordingly, in the typical operation mode, the respective terminals IO1, IO2, IO3, and IO4 are grounded through the VSS terminal, and in the test mode, it is possible to monitor an internal signal of the integrated circuit (IC) from the respective terminals IO1, IO2, IO3, and IO4, or it is possible to input a signal to the inside of the integrated circuit (IC).

Figure 2:
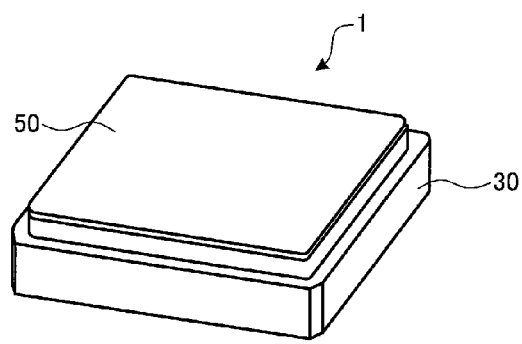
FIG. 2 is a perspective view of the electronic device of this embodiment.

The electronic device 1 of this embodiment is constituted in such a manner that the integrated circuit (IC) 10 and the vibrating element 20 are sealed into a package. FIG. 2 is a perspective view of the electronic device 1 of this embodiment, and FIG. 3 is an exploded perspective view of the electronic device 1.

Figure 3:
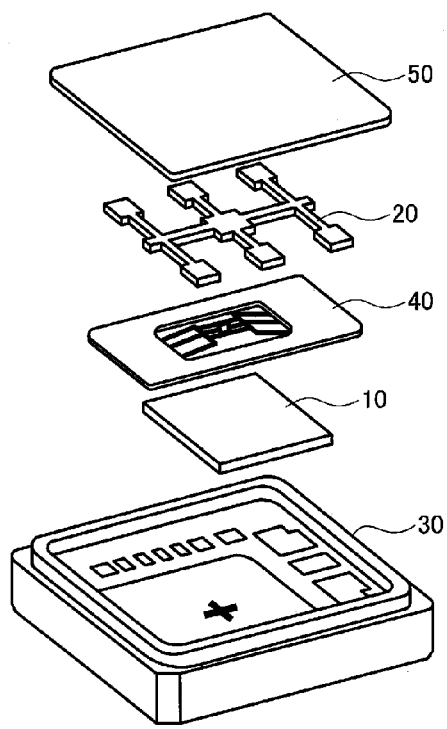
FIG. 3 is an exploded perspective view of the electronic device.

As shown in FIGS. 2 and 3, the electronic device 1 is mounted as a sensor package having the following structure. Specifically, the integrated circuit (IC) 10 is disposed at an opening of a ceramic package (an example of the package) 30 in which a plurality of layers are laminated, a vibrating element holding member 40 is disposed on an upper surface of the ceramic package 30, the vibrating element 20 is held on the vibrating element holding member 40 to vibrate, and a cover unit (lid) 50 is bonded to a seam ring provided on the upper surface of the ceramic package 30. The ceramic package 30 serves as casing of the integrated circuit (IC) 10 and the vibrating element 20, and plays a role of electrically connecting the integrated circuit (IC) 10 and the vibrating element 20 to the outside.

Figure 4:
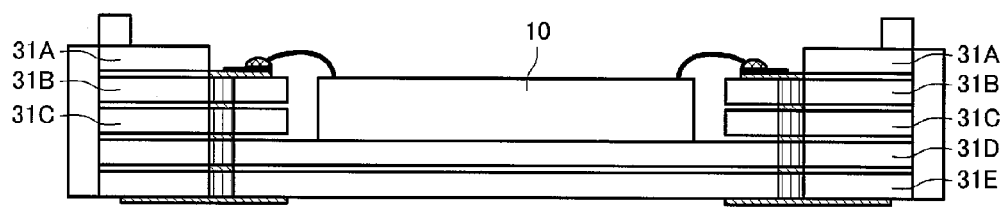
FIG. 4 is a view illustrating a longitudinal structure of a ceramic package.

FIG. 4 is a view illustrating a longitudinal structure of the ceramic package 30. As shown in FIG. 4, in the ceramic package 30, for example, five ceramic substrates 31A, 31B, 31C, 31D, and 31E are laminated. For example, the thickness of the ceramic package 30 (a total of the thickness of the respective ceramic substrates 31A, 31B, 31C, 31D, and 31E) is approximately 1 mm, and the length of one side of a surface of the ceramic substrate 31E is, for example, approximately 5 mm.

A conductive interconnection pattern is formed on the surface (in this embodiment, the interconnection pattern is formed on the upper surface, but may be formed on a lower surface) of each of the ceramic substrate. Parts of the interconnection patterns that are formed on the surface of two adjacent ceramic substrates are electrically connected to each other through a via formed in a through-hole (hole). For example, the "via" may be configured in such a manner that a conductive film is provided on an inner wall of the through-hole (hole) to electrically connect a front surface side and a rear surface side of a substrate, or may be configured in such a manner that a conductive material is filled inside the through-hole (hole) to electrically connect the front surface side and the rear surface side of the substrate. An interconnection pattern (external conductor pattern), which serves as an external terminal, is formed on the lower surface (bottom surface of the ceramic package 30) of the lowermost ceramic substrate 31E. The external conductor pattern (external terminal) is soldered to a printed substrate (not shown) for electrical connection with an external device.

An opening is provided at the center of each of the ceramic substrates 31A, 31B, and 31C, and the integrated circuit (IC) 10 is disposed in the opening. A metallized region, which is metallized by a material such as gold and nickel at least at a part of the interconnection pattern, is formed on the upper surface of the ceramic substrate 31B, and the terminal (electrode) of the integrated circuit (IC) 10 and the metallized region are wire-bonded.

As described above, the external conductor pattern is electrically connected to the integrated circuit (IC) 10 through a conductor pattern (internal conductor pattern) including a plurality of the interconnection patterns formed on the surface of the ceramic substrates 31A, 31B, 31C, 31D, and 31E, and a plurality of the vias that electrically connect the plurality of interconnection patterns.

A tungsten material or a material such as silver and copper having a low sheet resistance value is used for the interconnection pattern that is formed on the surface of each of the ceramic substrate and the via. In FIG. 4, an oblique line is drawn in the interconnection pattern, and a vertical line is drawn in the via.

A metallized region is provided at a part of an upper surface of the interconnection pattern that is formed on the upper surface of the ceramic substrate 31B, and is wire-bonded to a terminal (electrode) of the integrated circuit (IC) 10.

Figure 5:
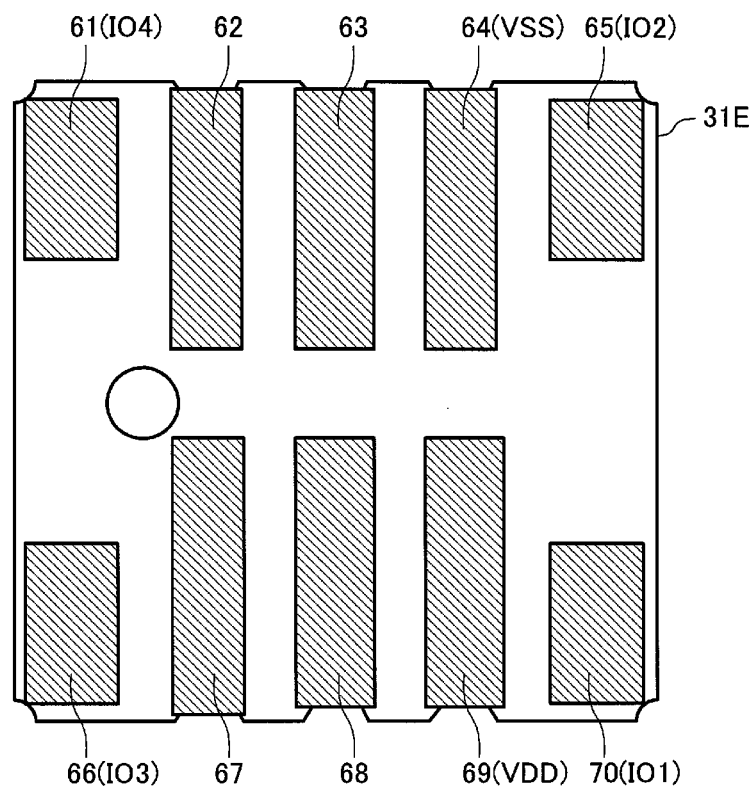
FIG. 5 is a view illustrating an example of an interconnection pattern that is formed in a ceramic substrate.

FIG. 5 is a view illustrating an example of an interconnection pattern (an interconnection pattern of an external terminal) that is formed on a lower surface of the ceramic substrate 31E.

As shown in FIG. 5, in this embodiment, ten interconnection patterns 61 to 70 are formed on a lower surface of the ceramic substrate 31E. In this embodiment, the package interconnection patterns 70, 65, 66, and 61 (an example of a first external terminal) are electrically connected to the respective terminals IO1, IO2, IO3, and IO4 (an example of the first terminal) of the integrated circuit (IC) 10, respectively. The interconnection pattern 64 (an example of a second external terminal) is electrically connected to the VSS terminal (an example of a second terminal) of the integrated circuit (IC) 10. The interconnection pattern 69 is electrically connected to the VDD terminal of the integrated circuit (IC) 10. Each of the remaining interconnection patterns 62, 63, 67, and 68 is electrically connected to arbitrary one of the four terminals SS, SCLK, SI, SO of the integrated circuit (IC) 10.

In this embodiment, among the ten interconnection patterns (external terminals) 61 to 70, the interconnection patterns (external terminals) 70, 65, 66, and 61, which are connected to the terminals IO1, IO2, IO3, and IO4 of the integrated circuit (IC) 10, respectively, are provided at a position that is closest to a corner. The interconnection patterns (external terminals) 70, 65, 66, and 61, which are connected to the terminals IO1, IO2, IO3, and IO4 of the integrated circuit (IC) 10, respectively, are external terminals to and from which a signal is not input or output in a typical operation mode (a state of being used by a user). Accordingly, among the ten interconnection patterns (external terminals) 61 to 70, the interconnection patterns 70, 65, 66, and 61 are provided at a position in which an effect of a stress is largest in a printed substrate, that is a position that is closest to a corner. In other words, the interconnection patterns 62, 63 64, 67, 68, and 69 to and from which a signal is input and output in a typical operation mode (a state of being used by a user) are not provided at the position closest to the corner in which the effect of a stress is largest.

In this embodiment, in a typical operation mode (a state of being used by a user), the interconnection patterns 70, 65, 66, and 61 are electrically connected to the interconnection pattern 64 at the inside of the sensor package (specifically, by the switch circuits 21A to 21D inside the integrated circuit (IC) 10). Accordingly, even when the interconnection patterns 70, 65, 66, and 61 are affected by a stress and are peeled from the printed substrate, if the interconnection pattern 69 is not peeled from the printed substrate, the grounded state of the interconnection patterns 70, 65, 66, and 61 does not vary.

Figure 6:
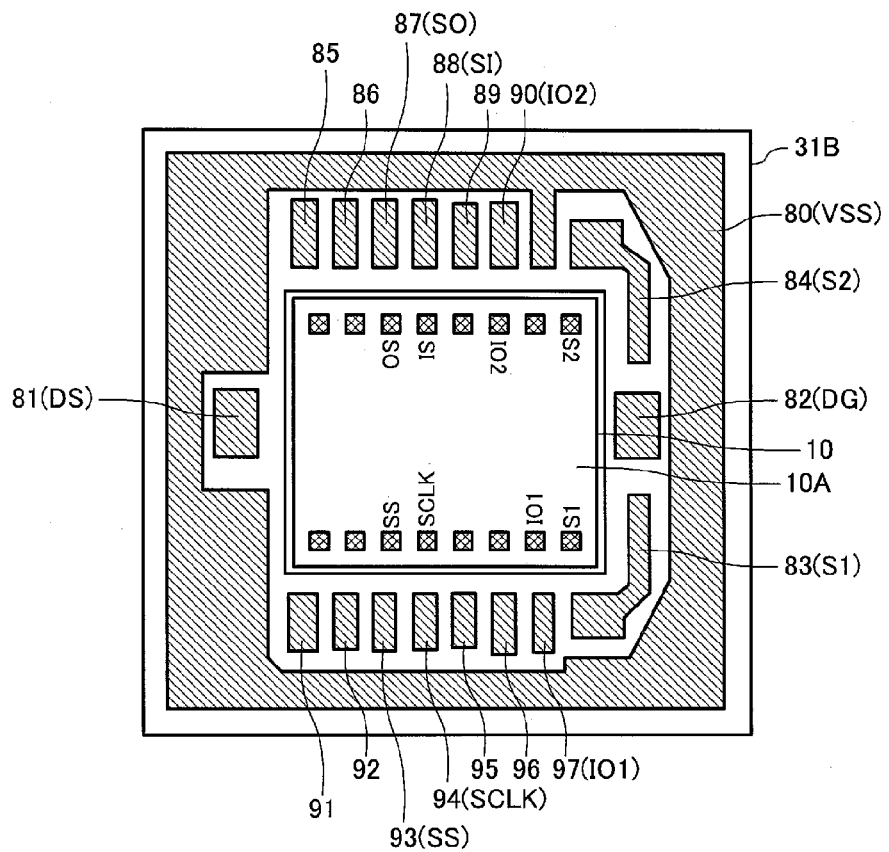
FIG. 6 is a view illustrating an example of an interconnection pattern that is formed in the ceramic substrate.

FIG. 6 is a view illustrating an example of the interconnection pattern that is formed on an upper surface of the ceramic substrate 31B. In addition, actually, a through-hole and a via, which electrically connect each interconnection pattern to an interconnection pattern on another ceramic substrate, are provided in the ceramic substrate 31B. However, the through-hole and the via are omitted for simplification in FIG. 6. In addition, FIG. 6 illustrates a state in which the integrated circuit (IC) 10 is disposed at an opening of the ceramic substrate 31B.

As shown in FIG. 6, in this embodiment, eighteen interconnection patterns 80 to 97 are formed on an upper surface of the ceramic substrate 31B (an example of a first layer).

The interconnection patterns 80, and 83 to 97 are connected to respective terminals (shaded with diagonal lines in FIG. 6) in a terminal arrangement portion 10A (a rectangular plane in FIG. 6) of the integrated circuit (IC) 10 that is disposed at an opening of the ceramic substrate 31B by wire bonding.

The interconnection pattern 81 is electrically connected to an input terminal for drive (drive electrode) of the vibrating element 20. The interconnection pattern 81 is electrically connected to arbitrary one of the interconnection patterns 85 to 97 through another ceramic substrate, and is also connected to the DS terminal of the integrated circuit (IC) 10 by wire bonding.

The interconnection pattern 82 is electrically connected to an output terminal for drive (drive electrode) of the vibrating element 20. The interconnection pattern 82 is electrically connected to arbitrary one of the interconnection patterns 85 to 97 through another ceramic substrate, and is also connected to the DG terminal of the integrated circuit (IC) 10 by wire bonding.

The interconnection pattern 83 is electrically connected to one output terminal for detection (detection electrode) of the vibrating element 20 through the ceramic substrate 31A. The interconnection pattern 83 is also connected to the S1 terminal (third terminal), which is provided at a position closest to a corner, among the terminals in the terminal arrangement portion 10A of the integrated circuit (IC) 10 by wire bonding. According to this, the interconnection pattern 83 can be made to be short, and can be spaced away from a digital input and output terminal of the integrated circuit (IC) 10. Accordingly, it is possible to reduce an effect of noise on an output signal of the vibrating element 20.

The interconnection pattern 84 is electrically connected to the other output terminal for detection (detection electrode) of the vibrating element 20 through the ceramic substrate 31A. The interconnection pattern 84 is also connected to the S2 terminal (third terminal), which is provided at a position closest to a corner, among the terminals in the terminal arrangement portion 10A of the integrated circuit (IC) 10 by wire bonding.

The interconnection pattern 80 is electrically connected to the interconnection pattern 64 that is formed on the ceramic substrate 31E through another ceramic substrate. The interconnection pattern 80 is also connected to the VSS terminal of the integrated circuit (IC) 10 by wire bonding.

In this embodiment, in the terminal arrangement portion 10A of the integrated circuit (IC) 10, at least one terminal (an example of the first terminal) of the terminals IO1, IO2, IO3, and IO4 is provided between the S1 terminal (an example of a third terminal) and the respective terminals SS, SCLK, SI, and SO (an example of a fourth terminal). Similarly, at least one terminal (an example of the first terminal) of the terminals IO1, IO2, IO3, and IO4 is provided between the S2 terminal (an example of the third terminal) and the respective terminals SS, SCLK, SI, and SO (an example of the fourth terminal). In addition, for example, the interconnection patterns 97 and 90 are electrically connected to the respective terminals IO1 and IO2 of the integrated circuit (IC) 10, and the interconnection patterns 93, 94, 88, and 87 are electrically connected to the terminals SS, SCLK, SI, and SO of the integrated circuit (IC) 10, respectively.

In a typical operation mode, the respective terminals S1 and S2 of the integrated circuit (IC) 10 are terminals to which a signal output from the vibrating element is input, and a minute signal propagates through the interconnection patterns 83 and 84. On the other hand, the respective terminals SS, SCLK, SI, and SO of the integrated circuit (IC) 10 are terminals to or from which a digital signal is input or output, and a digital signal, which is a noise source, propagates through the interconnection patterns 93, 94, 88, and 87. In this embodiment, the interconnection pattern 97 (an example of a first interconnection pattern) is located between the interconnection pattern 83 (an example of a second interconnection pattern) and the interconnection patterns 93 and 94 (an example of a third interconnection pattern), and in a typical operation mode, the interconnection pattern 97 is grounded, and thus it is possible to shield capacitive coupling between the interconnection pattern 83 and the interconnection patterns 93 and 94. Similarly, the interconnection pattern 90 (an example of the first interconnection pattern) is located between the interconnection pattern 84 (an example of the second interconnection pattern) and the interconnection patterns 87 and 88 (an example of the third interconnection pattern), and in a typical operation mode, the interconnection pattern 90 is grounded, and thus it is possible to shield capacitive coupling between the interconnection pattern 84 and the interconnection patterns 87 and 88. Accordingly, it is possible to suppress overlapping of noise on the minute signal, which is output from the vibrating element 20, due to the digital signal.

Figure 7:
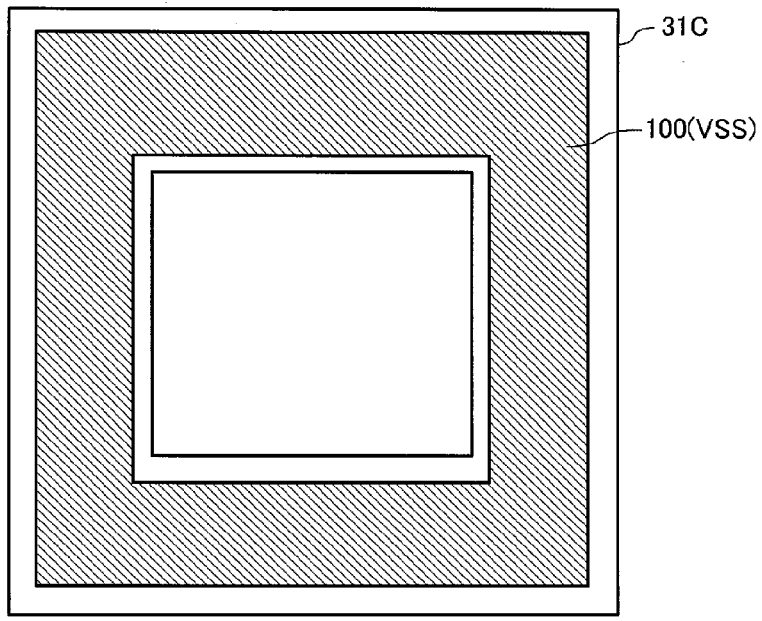
FIG. 7 is a view illustrating an example of an interconnection pattern that is formed in the ceramic substrate.

FIG. 7 is a view illustrating an example of an interconnection pattern that is formed on an upper surface of the ceramic substrate 31C. In addition, actually, a through-hole and a via, which electrically connect each interconnection pattern to an interconnection pattern on another ceramic substrate, are provided in the ceramic substrate 31C. However, the through-hole and the via are omitted for simplification in FIG. 7.

As shown in FIG. 7 in this embodiment, an interconnection pattern 100 is formed on the upper surface of the ceramic substrate 31C (an example of the second layer).

The interconnection pattern 100 is electrically connected to the interconnection pattern 80 that is formed on the ceramic substrate 31B, and is connected to the VSS terminal of the integrated circuit (IC) 10 by wire bonding. The interconnection pattern 100 is formed on almost whole surface except for the opening of the ceramic substrate 31B. Accordingly, a region in which the interconnection pattern 100 (an example of a fourth interconnection pattern) is formed includes a position (overlapping position in a plan view) that faces the interconnection patterns 83 and 84 (an example of the second interconnection pattern) formed on the ceramic substrate 31B, and thus the region serves as a shield with respect to the interconnection patterns 83 and 84 through which a minute signal propagates.

In addition, the interconnection pattern 100 is very thin, and thus has some resistance value. Therefore, even when the interconnection pattern 100 is grounded, when a signal propagates through the interconnection pattern that is formed on an upper surface of the ceramic substrate 31D, a potential of the interconnection pattern 100 partially varies. A minute signal, which propagates through the interconnection patterns 83 and 84, is affected depending on a position at which the potential varies, thereby causing deterioration in detection accuracy of the electronic device 1. Accordingly, it is preferable that an interconnection pattern through which a signal propagates is not formed at a position, which faces the interconnection patterns 83 and 84, on the upper surface of the ceramic substrate 31D. However, in some cases, there is no choice but to form some interconnections due to restriction on the interconnection rule, and the like. In the cases, in this embodiment, interconnection patterns, which are electrically connected to the terminals IO1, IO2, IO3, and IO4 of the integrated circuit (IC) 10, respectively, may be formed at a position, which faces the interconnection patterns 83 and 84, on the upper surface of the ceramic substrate 31D. In a typical operation mode, all of the interconnection patterns are grounded, and thus the minute signal, which propagates through the interconnection patterns 83 and 84, may not be affected.

As described above, according to the electronic device of this embodiment, a multifunctional I/O terminal is set to have a constant potential during a typical operation mode (during usage by a user), and thus it is possible to shield noise during digital communication with respect to a minute signal output from the vibrating element 20 due to the interconnection pattern that is connected to the multifunctional I/O terminal. Accordingly, a decrease in an S/N ratio of a detection signal is prevented, and a stable output can be obtained.

In addition, according to the electronic device of this embodiment, the multifunctional I/O terminal is electrically connected to the VSS terminal at the inside of the package during a typical operation mode (during usage by a user), and thus it is possible to stably perform shielding in an electronic device unit regardless of a mounting state. Accordingly, even when the multifunctional I/O terminal is not grounded on the printed substrate or even when a crack occurs in the multifunctional I/O terminal that is grounded or the multifunctional I/O terminal is peeled from the printed substrate, the multifunctional I/O terminal is prevented from serving as an antenna of an electromagnetic wave from the outside or being an input source of a noise signal from the outside, and thus a shield effect can be maintained.

In addition, according to the electronic device of this embodiment, during a test mode, it is possible to perform monitoring of various internal signals of the integrated circuit 10 or inputting of signal to various internal nodes of the integrated circuit 10 through the multifunctional I/O terminal. As described above, according to the electronic device of this embodiment, it is possible to effectively use the multifunctional I/O terminal during a typical operation mode (during usage by a user) and a test mode.

In addition, in this embodiment, the physical quantity sensor that is suitably used is exemplified as the electronic device 1, but the electronic device 1 may be an arbitrary electronic device, which operates on the basis of an electrical signal output from a vibrating element, in addition to the physical quantity sensor. For example, the electronic device 1 may be an oscillator using various vibrating elements such as a tuning fork type vibrator, an AT vibrator, a silicon vibrator, and a piezoelectric vibrator as a vibrating element.

2. Electronic Apparatus

Figure 8:
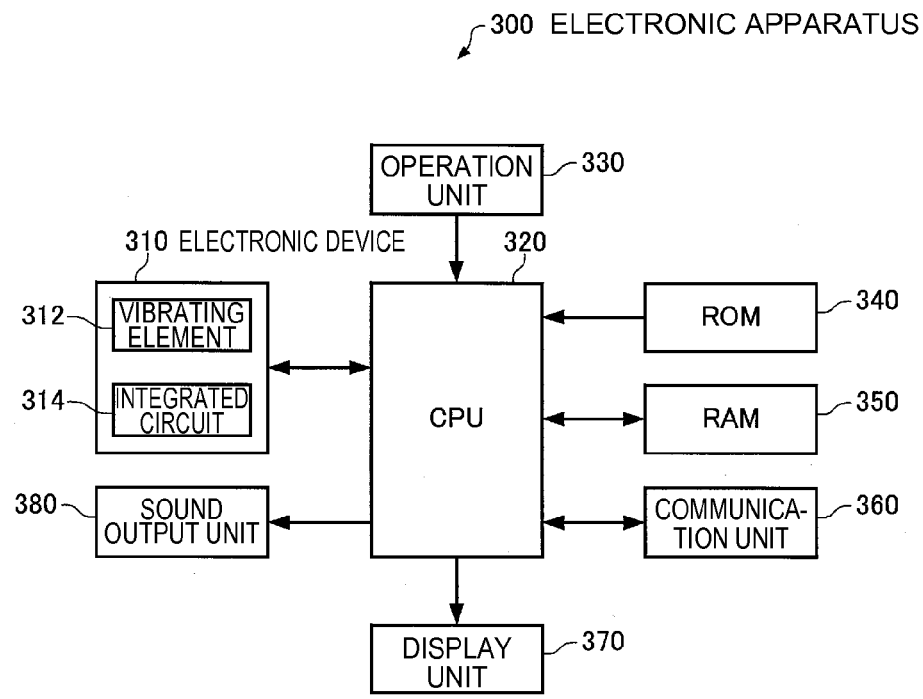
FIG. 8 is a functional block diagram of an electronic apparatus of this embodiment.
Figure 9:
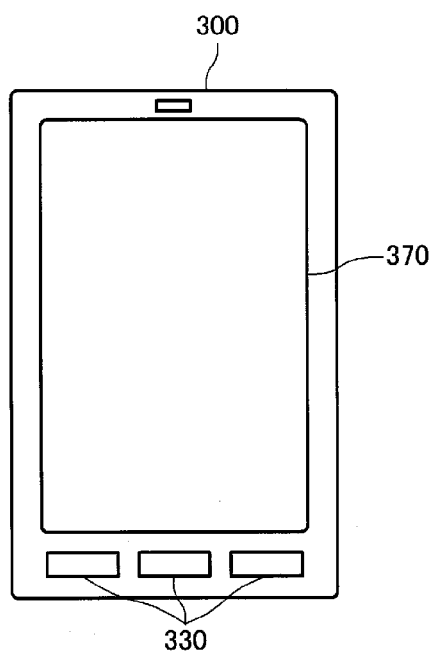
FIG. 9 is a view illustrating an example of an external appearance of the electronic apparatus of this embodiment.

FIG. 8 is a functional block diagram of the electronic apparatus of this embodiment. In addition, FIG. 9 is a view illustrating an example of an external appearance of a smart phone that is an example of the electronic apparatus of this embodiment.

The electronic apparatus 300 of this embodiment includes an electronic device 310, a central processing unit (CPU) 320, an operation unit 330, a read only memory (ROM) 340, a random access memory (RAM) 350, a communication unit 360, a display unit 370, and a sound output unit 380. In addition, the electronic apparatus of this embodiment may have a configuration in which parts of constituent elements (respective portions) in FIG. 8 are omitted or modified, or other constituent elements are added.

The electronic device 310 is an electronic device including a vibrating element 312 that outputs an electrical signal, and an integrated circuit 314 that is electrically connected to the vibrating element 312. For example, the electronic device 310 is a device in which the vibrating element 312 detects a physical quantity and the integrated circuit 314 outputs a signal (physical quantity signal) in a level according to a physical quantity that is detected. For example, the electronic device 310 may be an inertial sensor that detects at least a part of a physical quantity such as acceleration, an angular velocity, and a speed, or may be an inclinometer that measures an inclination angle or a pressure sensor that measures a pressure. In addition, for example, the electronic device 310 is an oscillator in which the integrated circuit 314 oscillates the vibrating element 312 at a desired frequency. The electronic device 310 may be an oscillator using various vibrating elements such as a tuning fork type vibrator, an AT vibrator, a silicon vibrator, and a piezoelectric vibrator as the vibrating element 312. As the electronic device 310, for example, the above-described electronic device 1 of this embodiment is applicable.

The CPU 320 performs various calculation processes or control process by using a signal that is output from the electronic device 310 according to a program that is stored in the ROM 340 and the like. In addition, the CPU 320 performs various processes according to operation signals transmitted from the operation unit 330, a process of controlling the communication unit 360 to conduct data communication with the outside, a process of transmitting a display signal to display various kinds of information on the display unit 370, a process of outputting various kinds of sound to the sound output unit 380, and the like.

The operation unit 330 is an input device that is constituted by an operation key, a button switch, and the like, and outputs an operation signal according to operation by a user to the CPU 320.

The ROM 340 stores a program to allow the CPU 320 to perform various calculation processes or control processes, data, and the like.

The RAM 350 is used as a work region of the CPU 320, and temporarily stores a program or data that is read out from the ROM 340, data that is input from the operation unit 330, a result of operation that is performed by the CPU 320 according to various programs, and the like.

The communication unit 360 performs various kinds of control to establish data communication between the CPU 320 and an external device.

The display unit 370 is a display device that is constituted by a liquid crystal display (LCD) or an organic EL display, and the like, and displays various kinds of information on the basis of a display signal that is input from the CPU 320. The display unit 370 may be provided with a touch panel that functions as the operation unit 330.

The sound output unit 380 is a device such as a speaker that outputs sound.

When being equipped with the above-described electronic device 1 of this embodiment as the electronic device 310, it is possible to realize an electronic apparatus with higher reliability.

As the electronic apparatus 300, various electronic apparatuses may be considered, and examples thereof include a personal computer (for example, a mobile type personal computer, a laptop type personal computer, a note type personal computer, a tablet type personal computer), a mobile terminal such as a portable phone, a digital still camera, an ink jet type ejection device (for example, an ink jet printer), a storage area network device such as a router and a switch, a local area network apparatus, a television, a video camera, a video tape recorder, a car navigation device, a pager, an electronic organizer (also including one equipped with a communication function), an electronic dictionary, a calculator, an electronic gaming machine, a controller for game, a word processor, a workstation, a videophone, a security television monitor, electronic binoculars, a POS terminal, a medical apparatus (for example, an electronic thermometer, a blood pressure meter, a blood glucose meter, an electrocardiogram measurement device, an ultrasonic diagnostic apparatus, and an electronic endoscope), a fish finder, various measurement apparatuses, meters (for example, meters of a vehicle, an aircraft, and a ship), a flight simulator, a head-mounted display, a motion tracer, a motion tracking device, a motion controller, a pedestrian dead reckoning (PDR) device, and the like.

3. Moving object

Figure 10:
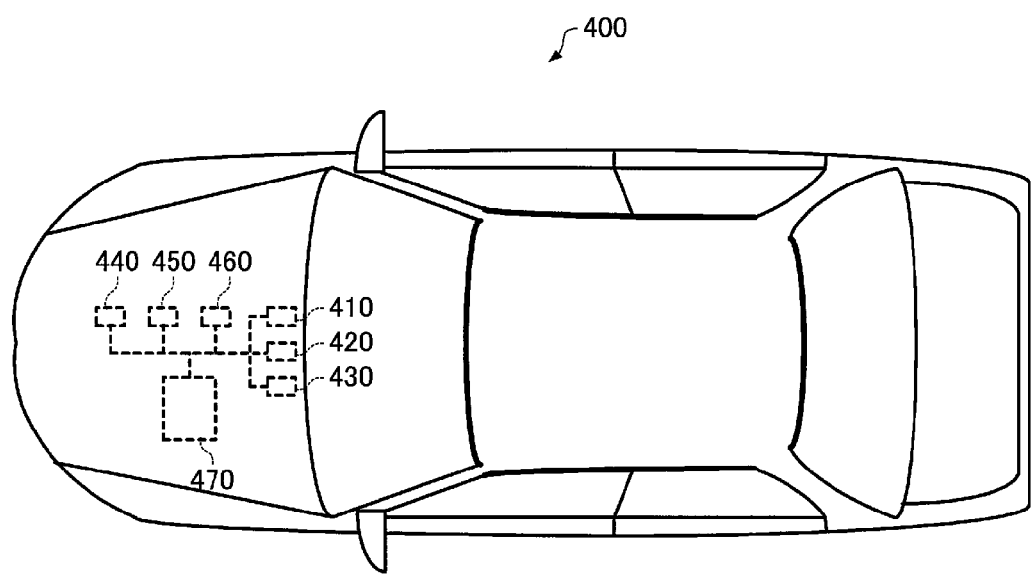
FIG. 10 is a view illustrating an example of a moving object of this embodiment.

FIG. 10 is a view (top view) illustrating an example of a moving object of this embodiment. A moving object 400 shown in FIG. 10 includes electronic devices 410, 420, and 430, controllers 440, 450, and 460, and a battery 470. In addition, the moving object of this embodiment may have a configuration in which parts of constituent elements (respective portions) in FIG. 10 are omitted or modified, or other constituent elements are added.

The electronic devices 410, 420, and 430, and the controllers 440, 450, and 460 operate using a power supply voltage supplied from the battery 470.

The electronic devices 410, 420, and 430 are electronic devices including a vibrating element (not shown) that outputs an electrical signal, and an integrated circuit (not shown) that is electrically connected to the vibrating element. For example, the electronic devices 410, 420, and 430 are devices in which the vibrating element detects a physical quantity and the integrated circuit outputs a signal (physical quantity signal) in a level according to a physical quantity. For example, the electronic devices 410, 420, and 430 may be an angular velocity sensor, an acceleration sensor, a speed sensor, a pressure sensor, an inclinometer, and the like. In addition, for example, the electronic devices 410, 420, and 430 are oscillators in which the integrated circuit oscillates the vibrating element at a desired frequency. The electronic devices 410, 420, and 430 may be oscillators using various vibrating elements such as a tuning fork type vibrator, an AT vibrator, a silicon vibrator, and a piezoelectric vibrator.

The controllers 440, 450, and 460 perform various kinds of control for an attitude control system, a roll-over prevention system, a brake system, and the like by using apart or the entirety of signals that are output from the electronic devices 410, 420, and 430, respectively.

As the electronic devices 410, 420, and 430, the above-described electronic device 1 of this embodiment is applicable, thereby securing higher reliability.

As the moving object 400, various moving objects can be considered, and examples thereof include a vehicle (also including an electric vehicle), an aircraft such as a jet aircraft and a helicopter, a ship, a rocket, a satellite, and the like.

In addition, the invention is not limited to the embodiments, and various modification can be made in a range without departing from the gist of the invention.

For example, in this embodiment, the multifunctional I/O terminal is electrically connected to the VSS terminal during a typical operation mode (during usage by a user), but the multifunctional I/O terminal may be connected to a terminal such as the VDD terminal having a constant potential. Even in this case, the shield effect can be exhibited due to the interconnection pattern that is connected to the multifunctional I/O terminal.

The invention includes substantially the same configuration (for example, a configuration in which a function, a method, and a result are the same, or a configuration in which an object and an effect are the same) as the configuration described in the embodiments. In addition, the invention includes a configuration in which substitution is made to portions that are not essential in the configuration described in the embodiments. In addition, the invention includes a configuration capable of exhibiting the same operational effect as the configuration described in the embodiments or a configuration capable of achieving the same object. In addition, the invention includes a configuration in which a known technology is added to the configuration described in the embodiments.

The entire disclosure of Japanese Patent Application No. 2013-087393, filed Apr. 18, 2013 is expressly incorporated by reference herein.

What is claimed is:

1. An electronic device comprising:
a vibrating element that outputs an electrical signal;
an integrated circuit includes:

a drive circuit that generates a drive signal to perform excitation vibration of the vibrating element; and
a detection circuit that generates a physical quantity signal based on the electrical signal transmitted from the vibrating element; and
a package, wherein
the package includes,
a first external terminal, and
a second external terminal that is electrically connected to a constant potential source,
the first external terminal is electrically connected to the second external terminal in a first mode, and is electrically connected to an internal node of the integrated circuit in a second mode, and
the internal node is one of a drive internal node of the drive circuit and a detection internal node of the detection circuit.

2. The electronic device according to claim 1,
wherein the integrated circuit includes,
a first terminal that is electrically connected to the first external terminal,
a second terminal that is electrically connected to the second external terminal, and
a switching control circuit which electrically connects the first terminal and the second terminal in the first mode, and which electrically connects the first terminal and the internal node in the second mode.

3. The electronic device according to claim 1, wherein the first external terminal is provided at a position that is closest to an arbitrary corner of the package in a plan view of the package.

4. An electronic apparatus comprising:
the electronic device according to claim 1.

5. A moving object comprising:
the electronic device according to claim 1.

6. The electronic device according to claim 1, wherein the package includes:
a base substrate; and
the first and second external terminals that are provided at a bottom surface of the base substrate.

7. The electronic device according to claim 2,
wherein the integrated circuit further includes,
a third terminal that is electrically connected to an output terminal of the vibrating element, and
the third terminal is provided at a position that is closest to an arbitrary corner of the integrated circuit in a plan view of the integrated circuit.

8. The electronic device according to claim 2,
wherein the integrated circuit further includes,
a third terminal that is electrically connected to an output terminal of the vibrating element, and
a fourth terminal to or from which a digital signal is input or output, and
the first terminal is provided between the third terminal and the fourth terminal.

9. The electronic device according to claim 6, wherein the first external terminal is located at a corner of the base substrate, and the second external terminal is located along one side of the base substrate.

10. The electronic device according to claim 8, wherein the third terminal is provided at a position that is closest to an arbitrary corner of the integrated circuit in a plan view of the integrated circuit.

11. The electronic device according to claim 8,
wherein the package includes a first layer,
the first layer is provided with,
a first interconnection pattern that electrically connects the first external terminal and the first terminal of the integrated circuit,
a second interconnection pattern that electrically connects the output terminal of the vibrating element and the third terminal of the integrated circuit, and
a third interconnection pattern that is electrically connected to the fourth terminal of the integrated circuit, and
the first interconnection pattern is provided between the second interconnection pattern and the third interconnection pattern.

12. The electronic device according to claim 11,
wherein the package includes a second layer that is located between the first layer and the first external terminal, and
a fourth interconnection pattern having a constant potential is provided in the second layer, and in a plan view of the second layer, the fourth interconnection pattern includes a region that overlaps with the second interconnection pattern.

13. An integrated circuit comprising:
a detection circuit that generates a physical quantity signal based on an electrical signal transmitted from a vibrating element;
a drive circuit that generates a drive signal to perform excitation vibration of the vibrating element;
a first terminal that is electrically connected to a first external terminal;
a second terminal that is electrically connected to a second external terminal that is electrically connected to a constant potential source;
an internal node; and
a switching control circuit which electrically connects the first terminal and the second terminal in a first mode, and which electrically connects the first terminal and the internal node in a second mode, wherein
the internal node is one of a drive internal node of the drive circuit and a detection internal node of the detection circuit.

14. The integrated circuit according to claim 13, further comprising:
a terminal arrangement portion in which a plurality of terminals are arranged,
wherein a third terminal, which is electrically connected to the vibrating element, is provided in the terminal arrangement portion, and
the third terminal is provided at a position that is closest to an arbitrary corner of the terminal arrangement portion in a plan view of the terminal arrangement portion.

15. The integrated circuit according to claim 13, further comprising:
a third element that is electrically connected to the vibrating element, and
a fourth terminal to or from which a digital signal is input or output,
wherein the first terminal is provided between the third terminal and the fourth terminal.

16. The integrated circuit according to claim 13,
wherein the switching control circuit electrically connects the first terminal and the second terminal in the first mode, and electrically connects the first terminal and the detection internal node of the detection circuit in the second mode.

17. An electronic apparatus comprising:
an integrated circuit according to claim 13.

18. A moving object comprising:
the integrated circuit according to claim 13.

19. The integrated circuit according to claim 15, further comprising:
a terminal arrangement portion in which a plurality of terminals are arranged,
wherein the third terminal is provided at a position that is closest to an arbitrary corner of the terminal arrangement portion in a plan view of the terminal arrangement portion.

* * * * *